(12) United States Patent
Ukigai et al.

(10) Patent No.: US 10,697,552 B2
(45) Date of Patent: Jun. 30, 2020

(54) FAUCET VALVE

(71) Applicant: TOTO LTD., Kitakyushu-Shi, Fukuoka (JP)

(72) Inventors: Saori Ukigai, Kitakyushu (JP); Atsushi Teramoto, Kitakyushu (JP); Yuji Naka, Kitakyushu (JP)

(73) Assignee: TOTO LTD., Fukuoka (JP)

( * ) Notice: Subject to any disclaimer, the term of this patent is extended or adjusted under 35 U.S.C. 154(b) by 220 days.

(21) Appl. No.: 15/870,327

(22) Filed: Jan. 12, 2018

(65) Prior Publication Data

US 2018/0209550 A1    Jul. 26, 2018

(30) Foreign Application Priority Data

Jan. 26, 2017 (JP) .................. 2017-012183

(51) Int. Cl.
*B32B 9/00* (2006.01)
*F16K 11/06* (2006.01)
(Continued)

(52) U.S. Cl.
CPC ............ *F16K 11/06* (2013.01); *C04B 41/009* (2013.01); *C04B 41/52* (2013.01); *C04B 41/89* (2013.01); *C04B 41/90* (2013.01); *C23C 14/022* (2013.01); *C23C 14/025* (2013.01); *C23C 14/0605* (2013.01); *C23C 16/0245* (2013.01); *C23C 16/0272* (2013.01); *C23C 16/26* (2013.01);
(Continued)

(58) Field of Classification Search
None
See application file for complete search history.

(56) References Cited

U.S. PATENT DOCUMENTS 5,755,261 A * 5/1998 Fukuzawa ............... C08L 71/00
137/625.17
5,829,735 A * 11/1998 Ikeda .................... C04B 41/009
251/368
(Continued)

FOREIGN PATENT DOCUMENTS

CN    1729368 A    2/2006
CN    102906015 A    1/2013
(Continued)

OTHER PUBLICATIONS

Office Action from Singapore Application No. 10201800574T dated Jul. 9, 2018.
(Continued)

*Primary Examiner* — Seth Dumbris
*Assistant Examiner* — Kim S. Horger (57) ABSTRACT

Disclosed is a faucet valve including: a first valve body including a first slide surface, and formed from an alumina-based sintered body; and a second valve body including a second slide surface, and formed from an alumina-based sintered body, the first and second slide surfaces at least partially being in contact with each other with water in between. At least part of the second slide body is formed from a first amorphous carbon layer. The hardness of the first amorphous carbon layer is equal to or less than that of the alumina-based sintered body forming the first valve body. In the first amorphous carbon layer, a ratio (ID/IG) of a D peak to a G peak, measured by Raman spectroscopy, is greater than 0.5 but less than 1.9.

20 Claims, 4 Drawing Sheets

(51) Int. Cl.

| | | |
|---|---|---|
| *F16K 27/04* | (2006.01) | |
| *F16K 25/02* | (2006.01) | |
| *C04B 41/89* | (2006.01) | |
| *C23C 14/02* | (2006.01) | |
| *C04B 41/52* | (2006.01) | |
| *F16K 25/00* | (2006.01) | |
| *C04B 41/90* | (2006.01) | |
| *C04B 41/00* | (2006.01) | |
| *C23C 16/26* | (2006.01) | |
| *C23C 16/02* | (2006.01) | |
| *C23C 14/06* | (2006.01) | |
| *F16K 11/00* | (2006.01) | |
| *C04B 111/00* | (2006.01) | |

(52) U.S. Cl.
CPC ............ *F16K 25/005* (2013.01); *F16K 25/02* (2013.01); *F16K 27/04* (2013.01); *C04B 2111/00353* (2013.01); *F16K 19/006* (2013.01)

(56) References Cited

U.S. PATENT DOCUMENTS

| | | |
|---|---|---|
| 2008/0188383 A1 | 8/2008 | Iseki et al. |
| 2011/0229791 A1 | 9/2011 | Kageyama et al. |
| 2013/0065034 A1 | 3/2013 | Muramatsu |
| 2014/0030512 A1 | 1/2014 | Oohira et al. |
| 2014/0079910 A1* | 3/2014 | Tsugawa ............... C10M 103/02 428/141 |
| 2016/0069383 A1 | 3/2016 | Miyake et al. |
| 2017/0159837 A1 | 6/2017 | Koga |
| 2017/0283935 A1 | 10/2017 | Moriguchi et al. |
| 2018/0238450 A1* | 8/2018 | Ooshiro .............. C23C 16/0245 |

FOREIGN PATENT DOCUMENTS

| | | | |
|---|---|---|---|
| EP | 1067211 A1 | 1/2001 | |
| JP | 2004324890 A * | 11/2004 | |
| JP | 2004-353759 A | 12/2004 | |
| JP | 2006-188734 A | 7/2006 | |
| WO | WO-2005/015065 A2 | 2/2005 | |
| WO | WO-2016/006645 A1 | 1/2016 | |
| WO | WO-2016/042630 A1 | 3/2016 | |
| WO | WO-2017026043 A1 * | 2/2017 | ......... C23C 16/0245 |

OTHER PUBLICATIONS

Office Action from Chinese Application No. 201810057924.3 dated Aug. 8, 2019 (machine translation).

Technical report of NSK Ltd., CAT. No. E728g, Chapter 10 "Bearing Materials" (accessed from http://www.nsk.com.br/upload/file/nsk_cat_e728g_10.pdf) (2013).

Technical Sheet No. 08003, published by Technology Research Institute of Osaka (accessed from http://tri-osaka.jp/technicalsheet/8003.PDF) (Jul. 15, 2008).

* cited by examiner

FAUCET VALVE

TECHNICAL FIELD

The present invention relates to a faucet valve.

BACKGROUND

In order to fabricate a faucet valve with high rigidity and high corrosion resistance at a low cost, use of inexpensive alumina has been studied. A faucet valve has been known in which one valve body is coated with an amorphous carbon layer in order to improve the slidability of the faucet valve (for example, Japanese Patent Application Publication No. Hei 9-126239). Generally, in a case where amorphous carbon is applied to a slide member, as hard an amorphous carbon layer as possible is used for the coating to make full use of a "hard" property of the amorphous carbon. As a result, in the faucet valve in which one valve body is coated with an amorphous carbon layer, the other valve body, provided with no coating film, usually wears due to their sliding (for example, [0021] in Japanese Patent Application Publication No. Hei 9-292039, and [0027] in the Japanese Patent Application Publication No. 2004-183699). Wear of a valve body formed from a sintered body and provided with no coating film, however, involves a problem that a large amount of hard wear debris originating from the sintered body is produced to deteriorate the sliding characteristic with time.

SUMMARY

An object of the present invention is to provide a faucet valve in which ceramic-made valve bodies slide on each other with water in between, the faucet valve achieving excellent slide performance.

The structure of the amorphous carbon layer is an amorphous structure in which a diamond-like structure and a graphite-like structure are mixed together. The ratio between the diamond-like structure and the graphite-like structure varies one another. The inventors have focused on a characteristic that the employment of a film structure softer than an alumina valve body for the amorphous carbon layer makes it possible to make wear debris relatively soft even in a case where the amorphous carbon layer is worn. In other words, the inventors selected an amorphous carbon layer whose hardness was equal to or less than that of its counterpart material, and deliberately worn the amorphous carbon layer by sliding the amorphous carbon layer. Furthermore, the inventors have managed to select the amorphous carbon layer that easily reacts with water. To put it specifically, the inventors set an ID/IG ratio in the amorphous carbon layer, measured by Raman spectroscopy, within a predetermined range, and thereby made it easy for the amorphous carbon layer to react with water. Consequently, the inventors have found that: such an amorphous carbon layer can be selectively worn when one valve body is slid over the other valve body with a very small amount of water in between; and the amorphous carbon layer makes it possible to relatively increase an amount of lubricant layer formed between the first and second valve bodies. The inventors have further made a finding that the selective wear and the increased amount of lubricant layer makes it possible to effectively inhibit progress in wear of the first and second valve bodies. Eventually, the inventors have completed the present invention based on these findings.

In other words, the present invention provides a faucet valve including: a first valve body including a first slide surface, and formed from an alumina-based sintered body; and a second valve body including a second slide surface, and formed from an alumina-based sintered body, the first and second slide surfaces at least partially being in contact with each other with water in between, wherein: a first amorphous carbon layer is provided to at least part of the second slide surface; hardness of the first amorphous carbon layer is equal to or less than that of the alumina-based sintered body forming the first valve body; and in the first amorphous carbon layer, a ratio (ID/IG) of a D peak to a G peak, measured by Raman spectroscopy, is greater than 0.5 but less than 1.9.

The present invention can provide the faucet valve in which ceramic-made valve bodies slide on each other with water in between, the faucet valve achieving excellent slide performance.

DESCRIPTION OF EMBODIMENTS

A faucet valve of the present invention includes: a first valve body including a first slide surface, and formed from an alumina-based sintered body; and a second valve body including a second slide surface, and formed from an alumina-based sintered body. In use, at least parts of the respective first and second slide surfaces are in contact with each other with water in between. In addition, a first amorphous carbon layer is provided to at least part of the second slide surface. The hardness of the first amorphous carbon layer is equal to or less than that of the alumina-based sintered body forming the first valve body. The hardness of the amorphous carbon layer is measured, for example, by nano-indentation. The hardness of the first amorphous carbon layer is preferably 30 GPa or less, and more preferably 25 GPa or less. On the other hand, the hardness of the first amorphous carbon layer is preferably greater than 8 GPa. This hardness of the first amorphous carbon layer makes it possible to form a lubricant layer easily, and to thus inhibit a progress in wear of the first amorphous carbon layer.

Furthermore, in the first amorphous carbon layer, a ratio (ID/IG) of a D peak to a G peak, measured by Raman spectroscopy, is greater than 0.5, but less than 1.9. The ratio (ID/IG) in the first amorphous carbon layer is preferably greater than 1.0 but less than 1.5, and more preferably not less than 1.1 but not greater than 1.4. The ratio (ID/IG) in the first amorphous carbon layer set within this range makes it possible to form the lubricant layer easily, and to thus inhibit the progress in wear of the first amorphous carbon layer. Moreover, in the first amorphous carbon layer, N/(N+S) measured by Raman spectroscopy is preferably less than 0.33, and more preferably 0.31 or less. The N/(N+S) is much more preferably 0.23 or greater. The N/(N+S) in the first amorphous carbon layer set within this range makes it possible to form the lubricant layer easily, and to thus inhibit the progress in wear of the first amorphous carbon layer.

In addition, the surface roughness (arithmetic average roughness Ra) of the first amorphous carbon layer is preferably less than 0.3 μm, more preferably less than 0.2 μm, and much more preferably less than 0.1 μm. The surface roughness of the first amorphous carbon layer set within this range makes it possible to decrease the wear amount of the first amorphous carbon layer.

Moreover, the first amorphous carbon layer may further contain a third element(s) such as Si, Cl, N, F and O. The first amorphous carbon layer containing the third element(s) makes it possible to decrease the coefficient of friction, to reduce lever operating force more, and to slide the second valve body over the first valve body smoothly.

The thickness of the first amorphous carbon layer is 0.5 μm or greater, and more preferably 1 μm or greater. The thickness of the first amorphous carbon layer set within this range makes it possible to form the lubricant layer well even in a case where the first amorphous carbon layer wears slightly.

Furthermore, for the purpose of enhancing the adhesion between the second valve body and the first amorphous carbon layer, an intermediate layer may be provided between the first amorphous carbon layer and the second valve body. Moreover, in this case, a composite layer or an inclination layer may be provided between the first amorphous carbon layer and the intermediate layer. In this respect, the composite layer is a layer that contains amorphous carbon and the same intermediate layer material as that contained in the intermediate layer. In this composite layer, the amorphous carbon and the intermediate layer material may be stacked alternately. Otherwise, the amorphous carbon and the intermediate layer material may be mixed together. The inclination layer is a layer that contains amorphous carbon and the same intermediate layer material as that contained in the intermediate layer, where the content of the intermediate layer material decreases from the intermediate layer toward the first amorphous carbon layer, and/or, where the content of the amorphous carbon increases from the intermediate layer toward the first amorphous carbon layer. The composite layer and/or the inclination layer can be checked by element mapping using an energy dispersive X-ray analyzer, for example. The intermediate layer material contained in the intermediate layer is not limited to a particular one, as long as it can enhance the adhesion between the second valve body and the first amorphous carbon layer. Examples of the intermediate layer material include Cr, W, Ti, Si and Al.

A second amorphous carbon layer may be provided to at least part of the first slide surface. In this case, the hardness of the first amorphous carbon layer and the hardness of the second amorphous carbon layer may be equal to or different from each other.

Moreover, the second amorphous carbon layer may further contain a third element (s) such as Si, Cl, N, F and O. The second amorphous carbon layer containing the third element(s) makes it possible to decrease the coefficient of friction, to reduce the lever operating force more, and to slide the second valve body over the first valve body smoothly.

Besides, for the purpose of enhancing the adhesion between the first valve body and the second amorphous carbon layer, an intermediate layer may be provided between the second amorphous carbon layer and the first valve body. Moreover, in this case, a composite layer or an inclination layer may be provided between the second amorphous carbon layer and the intermediate layer. In this respect, the composite layer is a layer that contains amorphous carbon and the same intermediate layer material as that contained in the intermediate layer. The inclination layer is a layer that contains amorphous carbon and the same intermediate layer material as that contained in the intermediate layer, where the content of the intermediate layer material decreases from the intermediate layer toward the second amorphous carbon layer. The intermediate layer material contained in the intermediate layer is not limited to a particular one, as long as it can enhance the adhesion between the first valve body and the second amorphous carbon layer. Examples of the intermediate layer material include Cr, W, Ti, Si and Al.

The alumina-based sintered body forming the first and second valve bodies contains alumina ($Al_2O_3$) as its main component. A commercially-available sintered body with sufficient strength and relatively few pores may be used as the alumina-based sintered body. The alumina-based sintered body containing alumina ($Al_2O_3$) as its main component may be used with an alumina ($Al_2O_3$) purity of 50% or greater, preferably 90% or greater, and more preferably 96% or greater.

Figure 1:
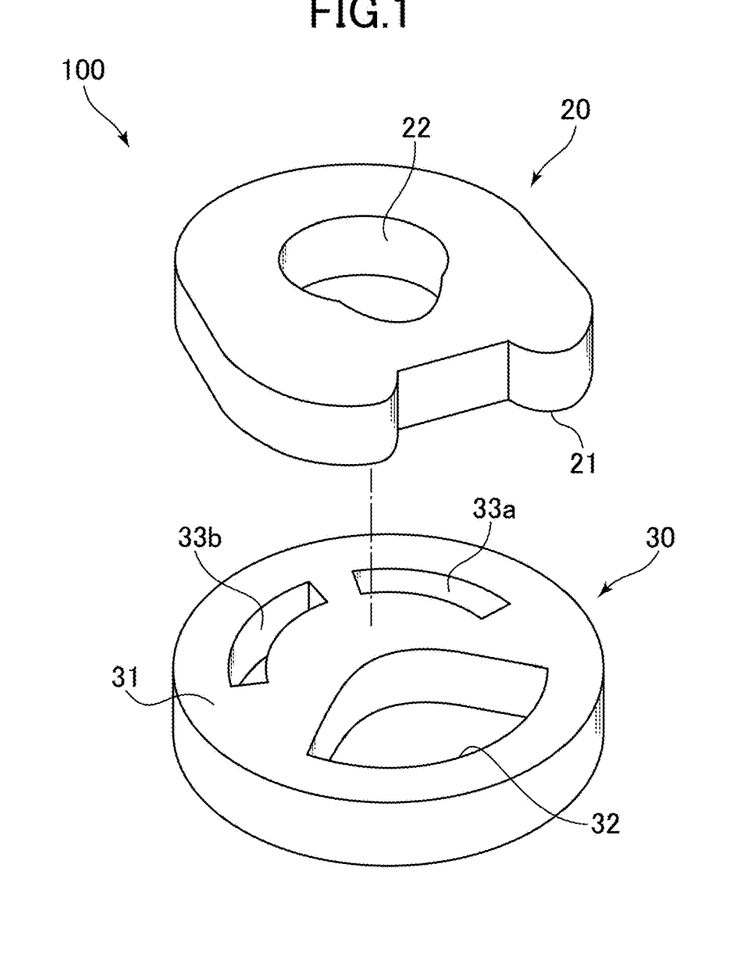
FIG. 1 is an exploded perspective view illustrating a faucet valve according to an embodiment of the present invention with its constituent valve bodies separated from each other.

The faucet valve according to the present invention will be hereinbelow described citing an example. The present invention, however, is not limited to this. FIG. 1 is an exploded perspective view illustrating the faucet valve 100 according to an embodiment of the present invention with its constituent valve bodies separated from each other.

The faucet valve 100 includes the first valve body and a second valve body. Descriptions will be herein provided for an example where: the second valve body is a movable valve body 20; and the first valve body is a fixed valve body 30. Nevertheless, the first and second valve bodies may be the movable valve body 20 and the fixed valve body 30, respectively. The movable valve body 20 includes a second slide surface 21. The fixed valve body 30 includes a first slide surface 31. In the faucet valve 100, at least parts of the respective first and second slide surfaces 31, 21 are in contact with each other with water in between.

Figure 2:
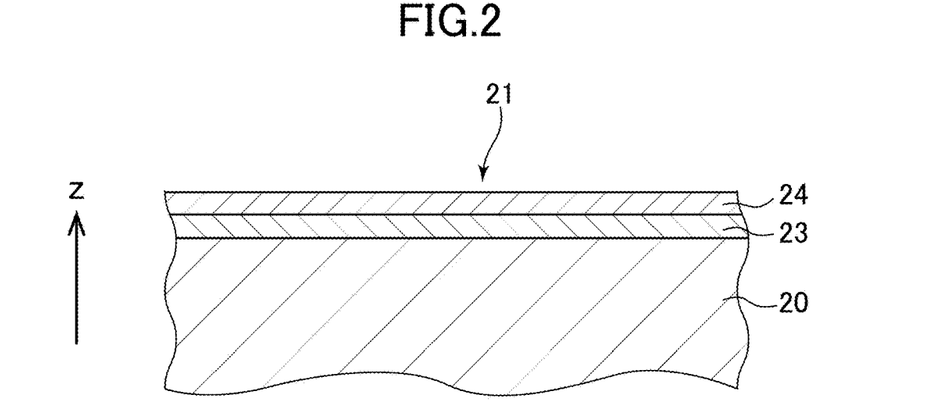
FIG. 2 is a magnified cross-sectional view illustrating a structure of a second valve body.

The movable valve body 20 (the second valve body) is, for example, a disk-shaped valve body that includes a fluid passage 22 penetrating through the movable valve body 20 between the upper and lower surfaces, and is formed from an alumina-based sintered body. In addition, as illustrated in FIG. 2, the slide surface 21 (the second slide surface) is formed on the surface of the movable valve body 20 by depositing an amorphous carbon layer 24 (a first amorphous carbon layer) on the surface of the movable valve body 20 with an intermediate layer 23 in between.

Furthermore, the fixed valve body 30 is formed as a disk-shaped valve body that is larger than the movable valve body 20, and that includes, for example, a fluid passage 32 and two fluid discharge ports 33a, 33b (for example, a hot water discharge port and a cold water discharge port) that penetrates through the fixed valve body 30 between the upper and lower surfaces.

Moreover, the slide surfaces 21, 31 are in intimate contact with each other with no lubricant in between. When the movable valve body 20 is slid over the fixed valve body 30 by moving a lever (not illustrated), the fluid passage 22, 32 included in the respective valve bodies 20, 30 are opened or closed. Thereby, the movable valve body 20 and the fixed valve body 30 controls a flow rate of supplied fluid, and controls opening degrees of the respective fluid discharge ports 33a, 33b.

In this respect, since the amorphous carbon layer with excellent self-lubricating properties is deposited on the slide surface 21 of the movable valve body 20, the movable valve body 20 can be smoothly slid over the fixed valve body 30 while avoiding much wear of the fixed valve body 30 and reducing a lever operating force regardless of no lubricant between the slide surfaces 21, 31.

A ratio of a D peak to a G peak and N/(N+S) in the amorphous carbon layer can be obtained using the following method.

To begin with, laser Raman spectroscopy is performed to obtain a Raman spectrum using a laser Raman microscope (RAMAN Touch VIS-NIR (made by Nanophoton)). The measurement magnification is at 20 times; and the measurement diameter is at ~1 micrometer. As a light source, a laser beam with a 532-nanometer wavelength and a 0.5 mW power is used. The exposure time is at 1 second, and the number of times of accumulation is at 10. The diffraction grating is at 600 gr/mm.

The analysis is performed using analysis software like OriginPro 2016 (produced by Lightstone Corporation). The background is removed from the waveform of the obtained Raman spectrum. Waveform separation is performed on two peaks around the wavenumbers 1350 cm-1 and 1530 cm-1 (respectively referred to as a "D band" and a "G band") by a curve fitting method using a Gaussian function. The areas of the D and G bands are respectively denoted by ID and IG, and a ratio between the areas of the two respective bands is denoted by ratio (ID/IG). An intensity ratio N/(N+S) is obtained where: S denotes the peak intensity of a Raman scattered light component at a peak position of the G band in the Raman spectrum; and N is the intensity of a fluorescent component (background).

The hardness of the amorphous carbon layer can be obtained using the following method.

The hardness of the amorphous carbon layer is measured using an ultra-small indentation hardness tester (ENT-2100 made by Elionix Inc. with a triangular-pyramid diamond indenter). For the measurement, a test load is at 5 mN, a step interval is at 20 msec, and a retention time is at 1000 msec. After the hardness is measured 10 times, the film hardness is obtained as an average of 8 measurement values that are obtained by excluding a maximum value and a minimum value from the 10 measurement values.

The surface roughness of the amorphous carbon layer can be obtained using the following method.

The surface roughness is measured using a surface roughness tester (SURFCOM 1500, made by Tokyo Seimitsu, Co., Ltd.) based on JIS B 0601: 2001, and is obtained as arithmetic average roughness (Ra).

EXAMPLES

More detailed descriptions will be provided for the present invention using the following examples. It should be noted that the present invention is not limited to these examples.

1. Sample Production
1-1. Base Material

An alumina-based sintered body with a 96-percent alumina purity was used as the base material of the second valve body. The slide surface (the second slide surface) of the sintered body was ground to have a predetermined surface roughness.

1-2. Making of Coating Layer (Amorphous Carbon Layer)

Examples 1 to 7 as Well as Comparative Examples 1, 4 to 7 and 9

An unbalanced magnetron sputtering system was used. The base material was baked using a heater at a predetermined temperature. The surface of the base material was etched with Ar plasma. Thereafter, the intermediate layer and the amorphous carbon layer were deposited on the resultant base material in this order. Chromium and tungsten were used as the materials of the intermediate layer. Solid carbon and hydrocarbon (methane and/or acetylene) gas were used as the materials of the amorphous carbon layer. The samples (the second valve bodies) of Examples 1 to 7 as well as Comparative Examples 1, 4 to 7 and 9 were obtained by controlling the deposition pressure, the hydrocarbon gas mixture ratio, the bias voltage to be applied to the base material, and the like. In each sample, the film thickness of the amorphous carbon layer was within a range of 0.5 μm to 2 μm. Incidentally, the same sample as prepared for Example 5 was used as the second valve body of Comparative Example 1.

Example 8 and Comparative Example 2

A plasma-enhanced chemical vapor deposition (CVD) system was used. Radio-frequency plasma and direct-current plasma were used as the plasma source. The surface of the base material was etched with Ar plasma. Thereafter, the intermediate layer and the amorphous carbon layer were deposited on the resultant base material in this order. Silicon carbide was used as the material of the intermediate layer. Hydrocarbon (methane and/or acetylene) gas was used as the material of the amorphous carbon layer. The samples of Example 8 and Comparative Example 2 were obtained by controlling the deposition pressure, the hydrocarbon gas mixture ratio, the bias voltage to be applied to the base material, and the like. In each sample, the film thickness of the amorphous carbon layer was at 1 μm.

Example 9

A plasma-enhanced chemical vapor deposition (CVD) system was used. Thermal-filament plasma was used as the plasma source. The surface of the base material was etched with Ar plasma. Thereafter, the intermediate layer and the amorphous carbon layer were deposited on the resultant base material in this order. Silicon carbide was used as the material of the intermediate layer. Hydrocarbon (methane and/or acetylene) gas was used as the material of the amorphous carbon layer. The sample of Example 9 was obtained by controlling the deposition pressure, the hydrocarbon gas mixture ratio, the bias voltage to be applied to the base material, and the like. The film thickness of the amorphous carbon layer was at 1 μm.

Example 10

A plasma-enhanced chemical vapor deposition (CVD) system was used. A linear ion source was used to generate ions. The surface of the base material was etched with Ar plasma. Thereafter, the intermediate layer and the amorphous carbon layer were deposited on the resultant base material in this order. The intermediate layer was deposited by unbalanced magnetron sputtering. Chromium was used as the material of the intermediate layer. Hydrocarbon (methane and/or acetylene) gas was used as the material of the amorphous carbon layer. The sample of Example 10 was obtained by controlling the deposition pressure, the hydrocarbon gas mixture ratio, the bias voltage to be applied to the base material, and the like. The film thickness of the amorphous carbon layer was at 1 μm.

Comparative Examples 3 and 8

An arc ion plating system was used. The base material was baked using a heater at a predetermined temperature. The surface of the base material was etched with Ar plasma. Thereafter, the intermediate layer and the amorphous carbon layer were deposited on the resultant base material in this order. Titanium was used as the material of the intermediate layer. Solid carbon was used as the material of the amorphous carbon layer. The samples of Examples 3 and 8 were obtained by controlling the deposition pressure, the bias voltage to be applied to the base material, and the like. In each sample, the film thickness of the amorphous carbon layer was at 1 μm.

2. Analysis and Evaluation Methods

Each sample prepared as discussed above was analyzed and evaluated as follows.

2-1. Raman Spectroscopic Analysis on Amorphous Carbon Layer (Ratio (ID/IG) and N/(N+S))

Measurement

For each sample, Laser Raman spectroscopic analysis was performed with the following conditions, and a Raman spectrum was obtained.

Apparatus: a laser Raman microscope, RAMAN Touch VIS-NIR (made by Nanophoton)
Conditions: Measurement Magnification at 20 times
Measurement diameter at ~1 μm
Light Source
  Laser Wavelength at 532 nm
  Laser Power at 0.5 mW
Exposure Time at 1 second
Number of times of Accumulation at 10
Diffraction Grating at 600 gr/mm Analysis OriginPro 2016 (produced by Lightstone Corporation) was used as the analysis software.

(Ratio (ID/IG))

For each sample, the background was removed from the waveform of the obtained Raman spectrum. Waveform separation was performed on the two peaks around the wavenumbers 1350 cm$^{-1}$ and 1530 cm$^{-1}$ (respectively referred to as a "D band" and a "G band") by the curve fitting method using the Gaussian function. The areas of the D and G bands were respectively denoted by ID and IG, and a ratio between the areas of the two respective bands is denoted by ratio (ID/IG).

(N/(N+S))

An intensity ratio N/(N+S) is obtained where: S denotes the intensity of a Raman scattered light component at the peak position of the G band in the Raman spectrum; and N denotes the intensity of the fluorescent component.

2-2. Hardness of Amorphous Carbon Layer: Nano Indentation Test

For each sample, the hardness of the amorphous carbon layer was measured using a Nano-indentation tester (ENT-2100 made by Elionix Inc. with a triangular-pyramid diamond indenter). The measurement conditions were the test load at 5 mN, the step interval at 20 msec, and the retention time at 1000 msec. After the hardness was measured 10 times, the film hardness value was obtained as an average of 8 measurement values that were obtained by excluding a maximum value and a minimum value from the 10 measurement values.

2-3. Surface Roughness (Ra) of Amorphous Carbon Layer: Surface Roughness Measurement For each sample, the arithmetic average roughness (Ra) was measured using a surface roughness tester (SURFCOM 1500, made by Tokyo Seimitsu, Co., Ltd.). The measurement conditions were set based on JIS B 0601: 2001.

As for the sample of Comparative Example 3, the surface roughness was measured at 0.2 μm, and the surface was rough. As for each of the other samples, the surface roughness was measured at 0.1 μm, and the surface was smooth.

2-4. Specific Wear: Ball-on-disk Friction Wear Test (Wear Test)

A ball-on-disk friction wear test was performed with the following conditions. The above-obtained samples of Examples 1 to 10 and Comparative Examples 1 to 9 were treated as the second valve body. An alumina-based sintered body or a stainless steel (SUS) was used as the material of a ball (the first valve body).

Tester: a friction wear tester, FPR-2100 (made by Rhesca Co., Ltd.)
Conditions: Load at 400 g
Speed at 10 mm/s
Oscillation Width at 5 mm
Number of Reciprocations at 5000
Oscillation Environment
  Room Temperature
  Underwater Calculation of Specific Wear Amount For each sample, the cross-sectional area of an abrasion mark on the amorphous carbon layer (the first amorphous carbon layer) after the friction wear test was measured using a laser microscope (OLS-4100, made by Olympus Corporation). Using the obtained cross-sectional area of the abrasion mark, the specific wear amount was calculated based of the following equation:

$$\text{Specific Wear Amount}\left[\frac{mm^3}{N}\cdot m\right] = \frac{(\text{Wear Volume }[mm^3])}{(\text{Load}[N])\times(\text{Slide Distance}[m])}.$$

2-5. Observation of Lubricant Layer

Figure 5A:
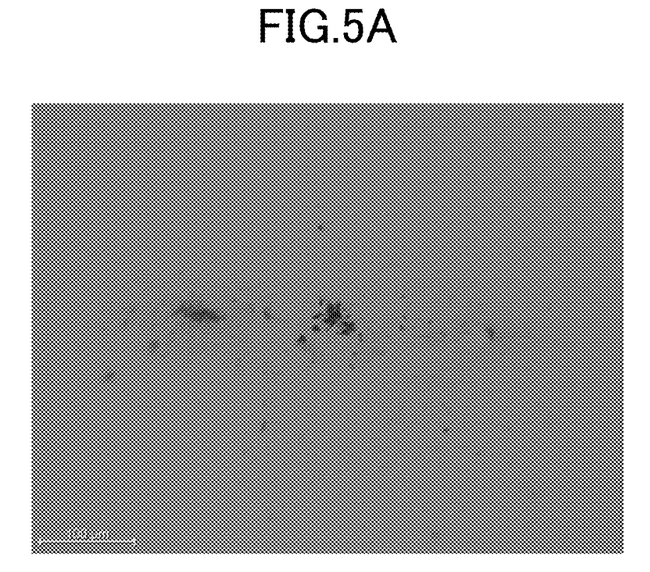
FIGS. 5A and 5B are photomicrographs of the first valve bodies (balls) of Example 3 and Comparative Example 3, respectively, taken after the ball-on-disk friction wear test.
Figure 5B:
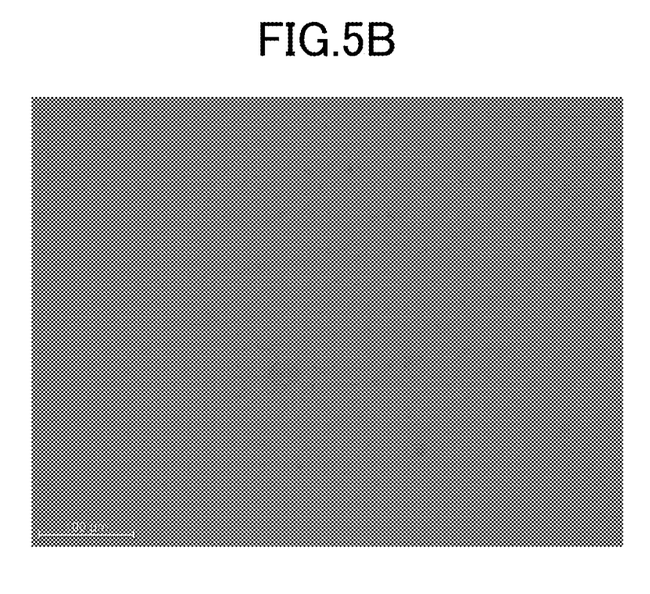

For each sample, after the wear amount calculation, the ball (the first valve body) was cleaned with ethanol, and was subsequently dried. After that, a wear track made on the ball (the first valve body) in the friction wear test was observed using a digital microscope (DVM6, made by Leica Microsystems). To put it specifically, the abrasion mark was observed with the following conditions: an exposure time at 33 ms; color gains at R400, G256 and B350; a color saturation at 25; a luminance brightness for CXI illumination at 60; no lambda plate used. Samples in which a lubricant layer derived from the amorphous carbon layer was observed were evaluated as being good, which is represented with ○ (white circle). Samples in which no lubricant layer derived from the amorphous carbon layer was observed were evaluated as being poor, which is represented with × (cross). FIGS. 5A and 5B show results of the observations of the lubricant layers of Example 3 and Comparative Examples 3, respectively.

2-6. Check of Composite Layer

For each sample, a specimen for observation was obtained by: cutting the sample after the deposition; and polishing the obtained cross section. The cross sections of the intermediate layer and the amorphous carbon layer were observed using a scanning electron microscope (S-4100, made by Hitachi, Ltd.). Using an energy dispersive X-ray analyzer (EMAX-7000, made by Horiba, Ltd.), an element map was produced to show the spatial distribution of carbon and intermediate layer elements in the field of view where each layer were observed. Thus, the existence of the amorphous carbon layer and the composite layer of the intermediate layer elements was confirmed in every sample.

3. Results

Figure 3:
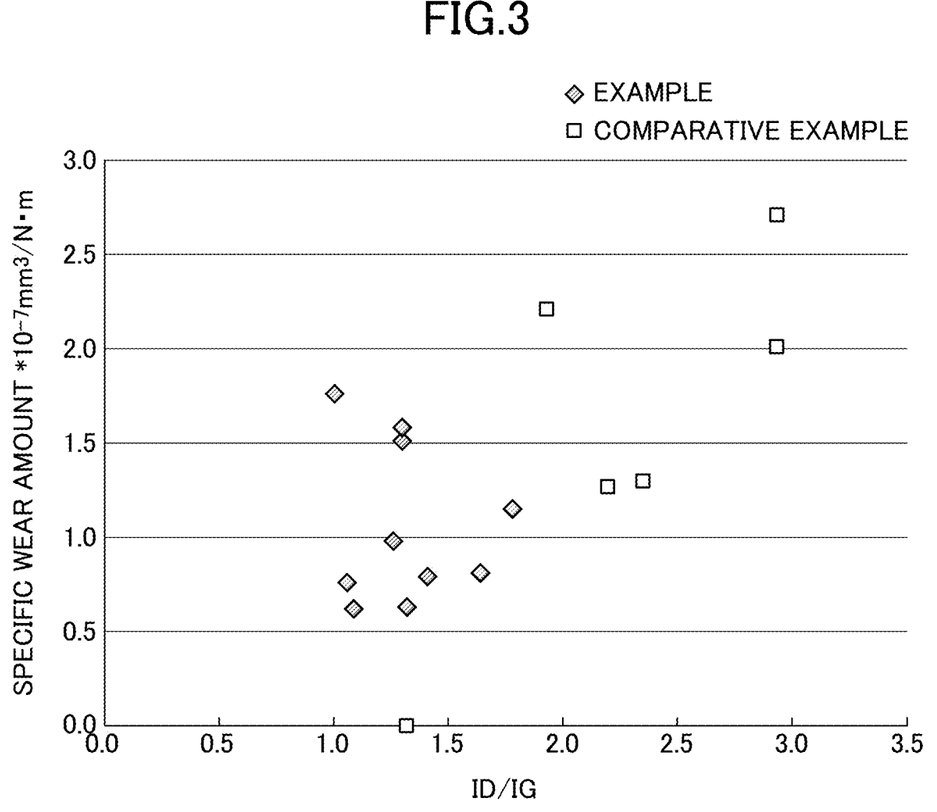
FIG. 3 is a graph showing a relationship between ratio (ID/IG) and a wear amount of an amorphous carbon layer in each of the examples and comparative examples (except for those where hardness of a first amorphous carbon layer was greater than that of an alumina-based sintered body forming a first valve body).
Figure 4:
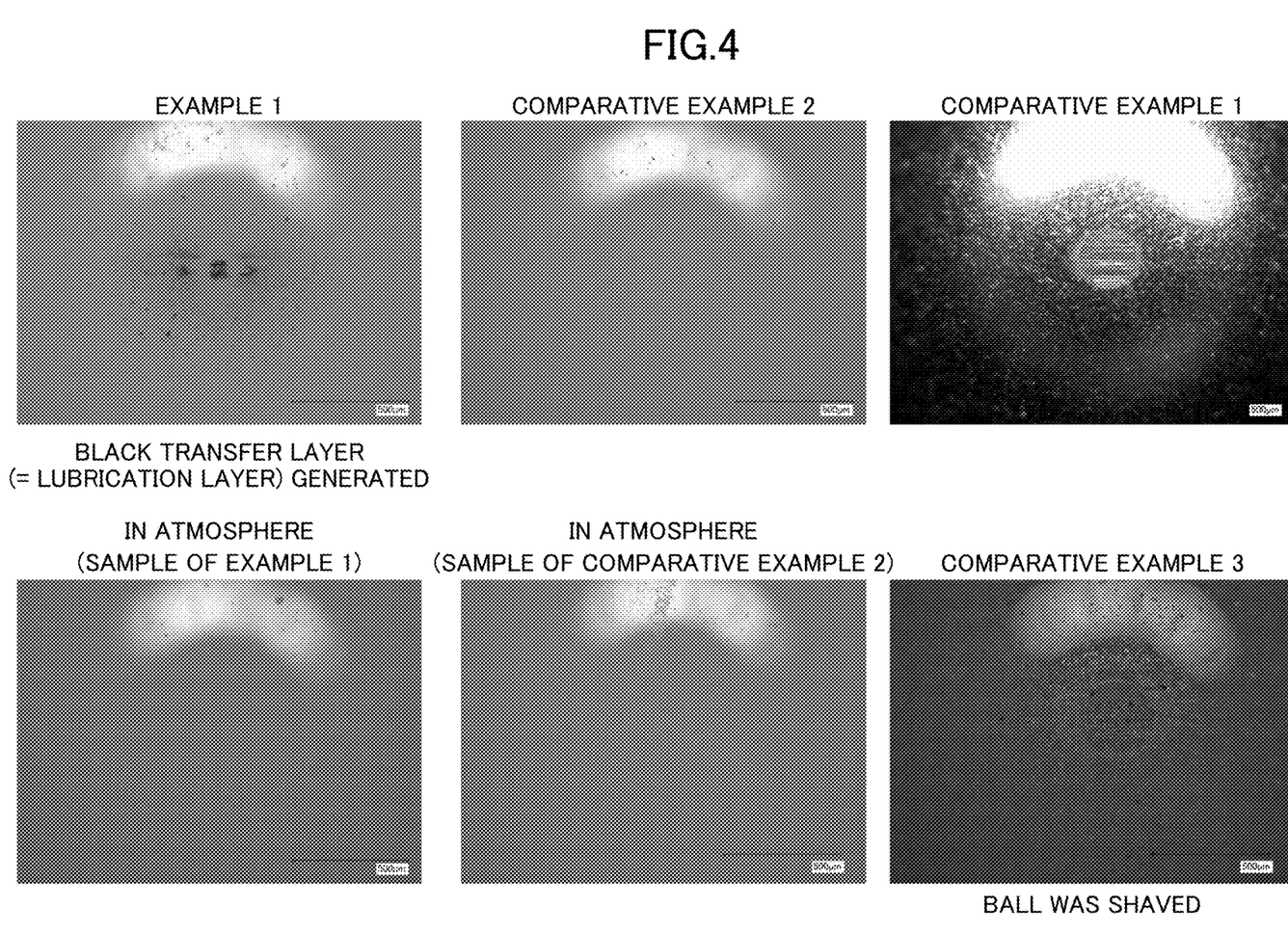
FIG. 4 shows photomicrographs of first valve bodies (balls) taken after a ball-on-disk friction wear test.

Table 1 shows the results of the above-discussed analysis and evaluation. In addition, the graph in FIG. 3 shows a relationship between the ratio (ID/IG) and the specific wear amount of the amorphous carbon layer in each of the examples and the comparative examples (except for those where the hardness of the first amorphous carbon layer was greater than that of the alumina-based sintered body forming the first valve body). These results shows that: in the case where the first valve body was formed from the alumina-based sintered body, the ratio (ID/IG) fell within a predetermined range (greater than 0.5 but less than 1.9), the lubricant layer was accordingly formed sufficiently, and the specific wear amount was small (Examples 1 to 6). In a case where the ratio (ID/IG) fell out of the range, no lubricant layer was formed, and the specific wear amount was large (Comparative Examples 2, 4 to 6, and 9). Meanwhile, in a case where the first valve body was formed from SUS, the amorphous carbon layer did not wear, and wear debris of the SUS were produced (Comparative Example 1).

TABLE 1

| | First Valve Body | | Second Valve Body | | | | | Evaluation | |
| --- | --- | --- | --- | --- | --- | --- | --- | --- | --- |
| | | | | Coating Layer | | | | | Specific |
| | Base Material | Hardness [GPa] | Base Material | Material | Hardness [GPa] | Ratio (ID/IG) | N/(N + S) | Shaved | Lubricant Layer | Wear *$10^{-7}$ mm$^3$/N · m |
| Example 1 | Alumina-based Sintered Body | 31 | Alumina-based Sintered Body | DLC | 20 | 1.1 | 0.31 | Second Valve Body | ○ | 0.8 |
| Example 2 | Alumina-based Sintered Body | 31 | Alumina-based Sintered Body | DLC | 29 | 1.3 | 0.26 | Second Valve Body | ○ | 1.6 |
| Example 3 | Alumina-based Sintered Body | 31 | Alumina-based Sintered Body | DLC | 16 | 1.4 | 0.27 | Second Valve Body | ○ | 0.8 |
| Example 4 | Alumina-based Sintered Body | 31 | Alumina-based Sintered Body | DLC | 25 | 1.3 | 0.23 | Second Valve Body | ○ | 1.0 |
| Example 5 | Alumina-based Sintered Body | 31 | Alumina-based Sintered Body | DLC | 14 | 1.3 | 0.28 | Second Valve Body | ○ | 0.6 |
| Example 6 | Alumina-based Sintered Body | 31 | Alumina-based Sintered Body | DLC | 19 | 1.3 | 0.28 | Second Valve Body | ○ | 1.5 |
| comparative example 1 | SUS | — | Alumina-based Sintered Body | DLC | 14 | 1.3 | 0.28 | First Valve Body | × | 0.0 |
| comparative example 2 | Alumina-based Sintered Body | 31 | Alumina-based Sintered Body | DLC | 16 | 1.9 | 0.33 | Second Valve Body | × | 2.2 |
| comparative example 3 | Alumina-based Sintered Body | 31 | Alumina-based Sintered Body | DLC | 41 | 0.5 | 0.46 | First Valve Body | × | 2.8 |
| Example 7 | Alumina-based Sintered Body | 31 | Alumina-based Sintered Body | DLC | 9 | 1.6 | 0.48 | Second Valve Body | ○ | 0.8 |
| Example 8 | Alumina-based Sintered Body | 31 | Alumina-based Sintered Body | DLC | 13 | 1.1 | 0.32 | Second Valve Body | ○ | 0.6 |
| Example 9 | Alumina-based Sintered Body | 31 | Alumina-based Sintered Body | DLC | 11 | 1.8 | 0.60 | Second Valve Body | ○ | 1.2 |
| Example 10 | Alumina-based Sintered Body | 31 | Alumina-based Sintered Body | DLC | 25 | 1.0 | 0.24 | Second Valve Body | ○ | 1.8 |
| comparative example 4 | Alumina-based Sintered Body | 31 | Alumina-based Sintered Body | DLC | 8 | 2.2 | 0.62 | Second Valve Body | × | 1.3 |
| comparative example 5 | Alumina-based Sintered Body | 31 | Alumina-based Sintered Body | DLC | 8 | 2.3 | 0.58 | Second Valve Body | × | 1.3 |
| comparative example 6 | Alumina-based Sintered Body | 31 | Alumina-based Sintered Body | DLC | 7 | 2.9 | 0.59 | Second Valve Body | × | 2.0 |
| comparative example 7 | Alumina-based Sintered Body | 31 | Alumina-based Sintered Body | DLC | 34 | 1.5 | 0.30 | First Valve Body | × | 2.5 |
| comparative example 8 | Alumina-based Sintered Body | 31 | Alumina-based Sintered Body | DLC | 35 | 1.0 | 0.74 | First Valve Body | × | 1.4 |
| comparative example 9 | Alumina-based Sintered Body | 31 | Alumina-based Sintered Body | DLC | 7 | 2.9 | 0.59 | Second Valve Body | × | 2.7 |

The invention claimed is:

1. A faucet valve comprising:
    a first valve body including a first slide surface, and formed from an alumina-based sintered body; and
    a second valve body including a second slide surface, and formed from an alumina-based sintered body, the first and second slide surfaces at least partially being in contact with each other with water in between, wherein
    a first amorphous carbon layer is provided to at least part of the second slide surface,
    hardness of the first amorphous carbon layer is equal to or less than that of the alumina-based sintered body forming the first valve body, and
    in the first amorphous carbon layer, a ratio (ID/IG) of a D peak to a G peak, measured by Raman spectroscopy, is greater than 0.5 but less than 1.9.

2. The faucet valve according to claim 1, wherein the ratio (ID/IG) is greater than 1.0 but less than 1.5.

3. The faucet valve according to claim 1, wherein the ratio (ID/IG) is 1.1 or greater but 1.4 or less.

4. The faucet valve according to claim 1, wherein N/(N+S) measured by Raman spectroscopy is less than 0.33.

5. The faucet valve according to claim 1, wherein N/(N+S) measured by Raman spectroscopy is 0.31 or less.

6. The faucet valve according to claim 5, wherein the N/(N+S) is 0.23 or greater.

7. The faucet valve according to claim 1, wherein the hardness of the first amorphous carbon layer is 30 GPa or less.

8. The faucet valve according to claim 1, wherein the hardness of the first amorphous carbon layer is 25 GPa or less.

9. The faucet valve according to claim 1, wherein surface roughness of the first amorphous carbon layer is less than 0.3 μm.

10. The faucet valve according to claim 1, wherein the first amorphous carbon layer further contains at least one element selected from the group consisting of Si, Cl, F, N and O as a third element.

11. The faucet valve according to claim 1, wherein a second amorphous carbon layer is provided to at least part of the first slide surface.

12. The faucet valve according to claim 11, wherein the hardness of the first amorphous carbon layer is different from the hardness of the second amorphous carbon layer.

13. The faucet valve according to claim 11, wherein the second amorphous carbon layer further contains at least one element selected from the group consisting of Si, Cl, F, N and O as a third element.

14. The faucet valve according to claim 11, further comprising a first intermediate layer between the second amorphous carbon layer and the first valve body.

15. The faucet valve according to claim 14, further comprising a first composite layer or a first inclination layer between the second amorphous carbon layer and the first intermediate layer, wherein
the first composite layer is a layer containing amorphous carbon and the same intermediate layer material as that contained in the first intermediate layer, and
the first inclination layer is a layer containing amorphous carbon and the same intermediate layer material as that contained in the first intermediate layer, where a content of the intermediate layer material decreases from the first intermediate layer toward the second amorphous carbon layer.

16. The faucet valve according to claim 1, further comprising a second intermediate layer between the first amorphous carbon layer and the second valve body.

17. The faucet valve according to claim 16, further comprising a second composite layer or a second inclination layer between the first amorphous carbon layer and the second intermediate layer, wherein
the second composite layer is a layer that contains amorphous carbon and the same intermediate layer material as that contained in the second intermediate layer, and
the second inclination layer is a layer that contains amorphous carbon and the same intermediate layer material as that contained in the second intermediate layer, where a content of the intermediate layer material decreases from the second intermediate layer toward the first amorphous carbon layer.

18. The faucet valve according to claim 14, wherein the first intermediate layer contain at least one intermediate layer material selected from the group consisting of Cr, W, Ti, Si and Al.

19. The faucet valve according to claim 16, wherein the second intermediate layer contain at least one intermediate layer material selected from the group consisting of Cr, W, Ti, Si and Al.

20. The faucet valve according to claim 1, wherein the hardness of the first amorphous carbon layer is greater than 8 GPa.

* * * * *